(12) United States Patent
Stella

(10) Patent No.: US 9,125,322 B2
(45) Date of Patent: Sep. 1, 2015

(54) THROUGH-HOLE MOUNTING SYSTEM WITH HEAT SINKING ELEMENTS CLAMPED TO ONE ANOTHER AGAINST INSULATING BODY

(71) Applicant: STMicroelectronics S.r.l., Agrate Brianza (IT)

(72) Inventor: Cristiano Gianluca Stella, San Gregorio di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 313 days.

(21) Appl. No.: 13/871,803

(22) Filed: Apr. 26, 2013

(65) Prior Publication Data

US 2013/0294032 A1 Nov. 7, 2013

(30) Foreign Application Priority Data

Apr. 27, 2012 (IT) ............... MI2012A0713

(51) Int. Cl.
*G06F 1/20* (2006.01)
*H05K 5/00* (2006.01)
(Continued)

(52) U.S. Cl.
CPC ............. *H05K 7/20* (2013.01); *H01L 21/302* (2013.01); *H01L 23/02* (2013.01); *H01L 23/34* (2013.01); *H01L 23/367* (2013.01); *H01L 23/3672* (2013.01); *H01L 23/4006* (2013.01); *H01L 23/4093* (2013.01); *H01L 23/48* (2013.01); *H05K 7/2039* (2013.01); *H05K 13/00* (2013.01); *H01L 23/38* (2013.01); *H01L 2924/0002* (2013.01); *Y10T 29/49002* (2015.01)

(58) Field of Classification Search
CPC .......... H05K 7/20; H01L 23/02; H01L 23/34; H01L 23/38; H01L 23/48; H01L 21/302

USPC ................. 361/676–678, 679.46–679.54, 361/688–723, 752, 760, 762, 831; 257/712, 257/734; 438/689
See application file for complete search history.

(56) References Cited

U.S. PATENT DOCUMENTS

| 4,268,850 A | 5/1981 | Lazarek et al. |
| 6,072,240 A | 6/2000 | Kimura et al. |

(Continued)

FOREIGN PATENT DOCUMENTS

| JP | 2001156219 A | 6/2001 |
| JP | 2004193476 | 7/2004 |

(Continued)

*Primary Examiner* — Courtney Smith
*Assistant Examiner* — Zhengfu Feng
(74) *Attorney, Agent, or Firm* — Seed IP Law Group PLLC (57) ABSTRACT

An electronic system includes an electronic device of through-hole mounting type comprising an insulating body for embedding at least a chip on which electronic components are integrated, a plurality of conductive leads projecting from the insulating body for said mounting, and a dissipation plate exposed from the insulating body for transferring heat from said electronic component in operation towards the outside of the insulating body. The electronic system includes a heat sink in contact with said dissipation plate for dissipating said heat. The heat sink comprises a first dissipation element, a second dissipation element, and clamping means for clamping the first dissipation element and the second dissipation element together against the insulating body of said electronic device.

10 Claims, 7 Drawing Sheets

(51) Int. Cl.
*H05K 7/20* (2006.01)
*H01L 23/34* (2006.01)
*H01L 23/48* (2006.01)
*H01L 31/107* (2006.01)
*H01L 23/02* (2006.01)
*H01L 21/302* (2006.01)
*H01L 23/367* (2006.01)
*H01L 23/40* (2006.01)
*H05K 13/00* (2006.01)
*H01L 23/38* (2006.01)

(56) References Cited

U.S. PATENT DOCUMENTS

| 6,703,707 | B1 | 3/2004 | Mamitsu et al. |
| 6,919,631 | B1 | 7/2005 | Hoffman et al. |
| 7,564,124 | B2 | 7/2009 | Lee et al. |
| 2001/0040246 | A1 | 11/2001 | Ishii |
| 2002/0024129 | A1 | 2/2002 | Hirahara et al. |
| 2003/0122232 | A1 | 7/2003 | Hirano et al. |
| 2004/0097082 | A1* | 5/2004 | Mamitsu et al. ............... 438/689 |
| 2004/0195649 | A1 | 10/2004 | Miura et al. |
| 2005/0056927 | A1* | 3/2005 | Teshima et al. ................ 257/712 |
| 2006/0090102 | A1 | 4/2006 | Wehrly, Jr. et al. |
| 2006/0138452 | A1 | 6/2006 | Knapp et al. |
| 2007/0075419 | A1 | 4/2007 | Fukuda et al. |
| 2007/0216013 | A1 | 9/2007 | Funakoshi et al. |
| 2008/0007920 | A1 | 1/2008 | Shiraki et al. |
| 2008/0054417 | A1 | 3/2008 | Lee et al. |
| 2009/0116197 | A1 | 5/2009 | Funakoshi et al. |
| 2009/0302444 | A1 | 12/2009 | Ueda et al. |
| 2011/0057713 | A1 | 3/2011 | Kawanami et al. |
| 2011/0310565 | A1* | 12/2011 | He ................. 361/715 |
| 2013/0285230 | A1 | 10/2013 | Stella et al. |

FOREIGN PATENT DOCUMENTS

| JP | 2005123233 A | 5/2005 |
| JP | 2008042074 A | 2/2008 |

* cited by examiner

FIG. 6

THROUGH-HOLE MOUNTING SYSTEM WITH HEAT SINKING ELEMENTS CLAMPED TO ONE ANOTHER AGAINST INSULATING BODY

BACKGROUND

1. Technical Field

The present disclosure refers to the field of electronics, and ore particularly, to a through-hole mounting system having heat sink elements coupled together.

2. Description of the Related Art

Any existing electronic component is characterized by absorption of electric power during operation thereof. A portion of the absorbed electric power is inevitably dispersed in the form of heat according to the principles of thermodynamics. Such generation of heat causes a rise of the working temperature of the electronic component, which may adversely affect its operation (since some electrical parameters of the electronic component are closely dependent on its working temperature). Furthermore, an excessively high working temperature may cause a damage or even the destruction of the electronic device. In addition, as the working temperature of the electronic device increases there is a reduction of its reliability (i.e., there increases the statistical probability of occurrence of a structural damage during the operation) and in general of its useful life (i.e., the time for which the electronic component works properly).

Limiting the working temperature is particularly important in electronic components belonging to the field of "power electronics", i.e., electronic components designed for operating at higher voltages and currents than conventional electronic components do; the power electronic components are used in the circuits of apparatuses belonging to various fields of use, for example, from computers to electromechanical machineries (such as power supply circuits of electronic processors, actuators of electric motors, inverters for photovoltaic panels, etc.).

Typically, the electronic components are integrated on chips of semiconductor material embedded in packages, each of which comprises an insulating body for insulating and protecting the electronic components from the external environment, and conductive pins (connected to conduction terminals of the chips) for making electrical connections with other electronic elements (e.g., electronic boards).

In the case of power electronic components the use packages of Through-Hole mounting Technology (THT) is common; in this case, the conductive pins (known as rheophores or conductive leads) extend from a mounting (lower) surface of the insulating body to be inserted and welded into suitable holes formed on the electronic boards, in order to obtain an electrical and mechanical connection therewith.

The known THT packages are usually bound to a heat sink (for example, a metal plate from which fins may extend for facilitating heat exchange with the surrounding environment), in such a way to disperse the heat produced by the electronic components for maintaining their working temperature within an acceptable range. For the mounting to the heat sink, the insulating body is usually provided with a perforated portion (with a smooth through hole), which allows fastening the insulating body to the heat sink via a bolt inserted into the through hole and bound to the heat sink.

However, the perforated portion increases a size of the insulating body without correspondingly increasing a useful space for embedding the chip since, due to the through hole, it is not possible to arrange the chip or part thereof in such perforated portion.

In addition, the attachment to the heat sink, if performed incorrectly, may compromise the package itself and/or the operation of the electronic component. For example, in the case where an excessive torque is applied to the bolt, the perforated portion may be deformed (breaking at the limit) compromising the fastening between the insulating body and the heat sink and therefore the dissipation of heat. Alternatively, it may happen that the pins may be deformed (breaking at the limit) during the fastening to the heat sink, thereby reducing a quality of the electrical connections being formed (and therefore the performance of the electronic components comprised in the package).

BRIEF SUMMARY

One embodiment of the present disclosure is directed to providing a heat sink with elements clamped to each other against the insulating body.

More specifically, an embodiment of the disclosure provides an electronic system comprising one or more electronic devices of THT type each having one or more dissipation plates (exposed from an insulating body thereof) and a heat sink in contact therewith, in which the heat sink comprises two dissipation elements clamped together against the insulating body of the electronic devices.

Another embodiment of the disclosure provides a heat sink for the use in such electronic system.

Another embodiment of the disclosure provides an electronic assembly comprising one or more of such electronic systems.

Another embodiment of the disclosure provides an apparatus comprising one or more of such electronic systems and/or electronic assemblies.

Another embodiment of the disclosure provides a corresponding method of assembly such electronic system.

BRIEF DESCRIPTION OF THE SEVERAL VIEWS OF THE DRAWINGS

Embodiments of the disclosure, as well as additional features and its advantages will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION

Figure 1A:
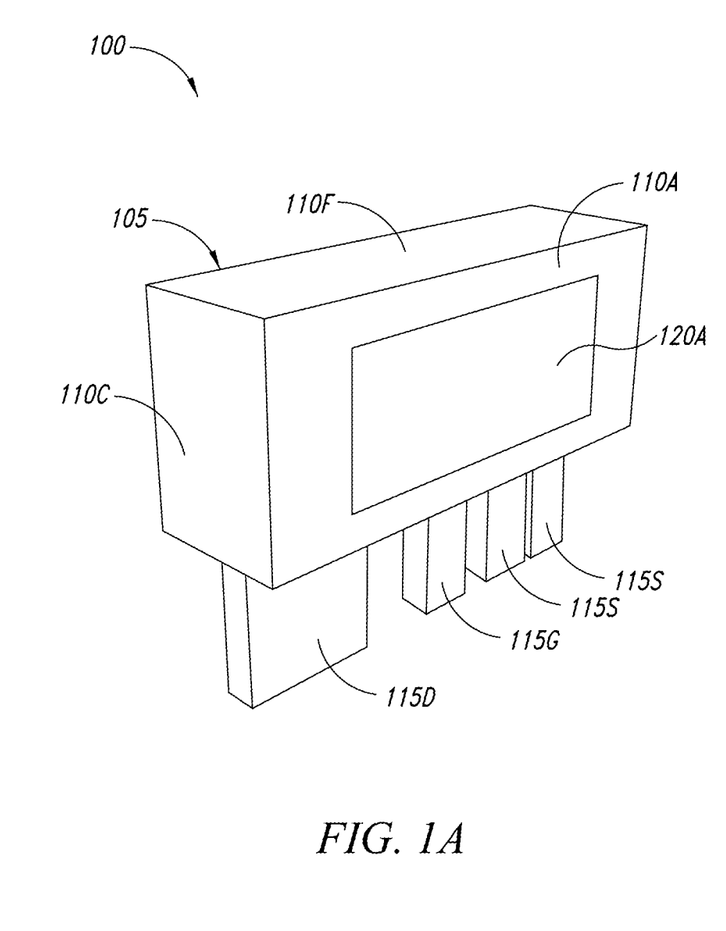
FIGS. 1A and 1B illustrate different schematic perspective views of an electronic device that may be used in an electronic system according to an embodiment of the present disclosure.
Figure 1B:
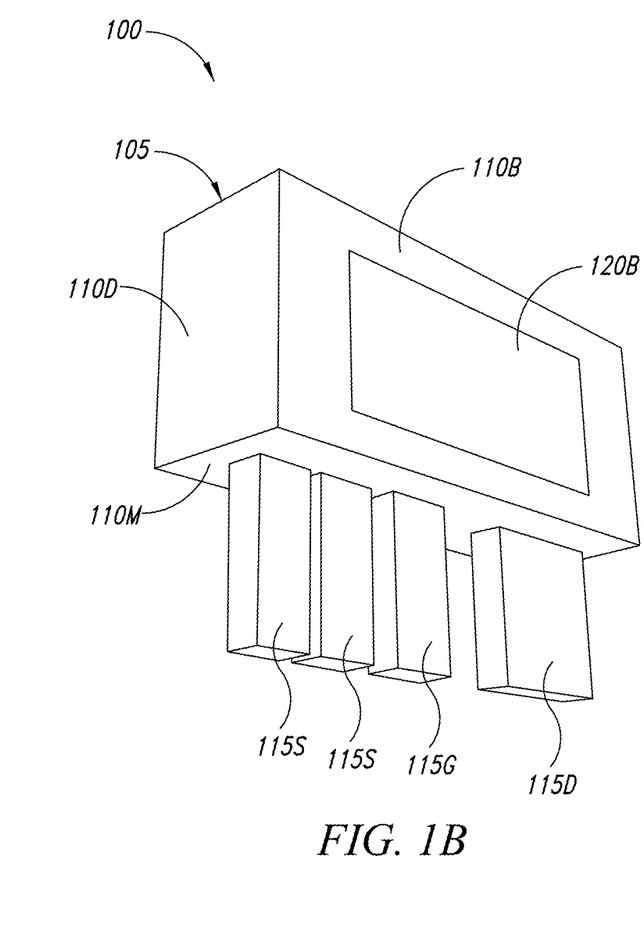

With joint reference to FIGS. 1A and 1B, these show various schematic perspective views of an electronic device 100 that may be used in an electronic system according to an embodiment of the present disclosure.

The electronic device 100 is a power device (e.g., adapted to operate at voltages of the order of hundreds of volts and/or currents of the order of tens of Amperes) of the THT type. In particular, the electronic device 100 comprises an insulating body 105 of electrically insulating material (e.g., plastic, epoxy or ceramic) of substantially parallelepiped shape. The insulating body 105 comprises two main surfaces 110A and 110B opposite each other, and larger than two side surfaces 110C and 110D, a mounting surface (lower) 110M and a free surface (upper) 110F interposed between them.

The insulating body 105 has the purpose to protect and insulate from the external environment one or more chips in semiconductor material, not visible in the figures, on each of which there is integrated an electronic component, or more—for example, a power MOS transistor. In order to obtain an electrical path between the chip and elements external to the electronic device 100—thereby enabling connecting the electronic components to other electronic devices not shown in the figure—various conductive leads protrude from the insulating body 105, downwards perpendicularly to its mounting surface 110M—for example, two source conductive leads 115S, a gate conductive lead 115G and a drain conductive lead 115D in the case of the MOS transistor. Each conductive lead 115S, 115D and 115G is formed by a peg in electrically conductive material (e.g., metal such as aluminum) in electrical contact (e.g., by means of a connection wire) with corresponding conduction terminals of the chip—i.e., one or more source terminals, a gate terminal and a drain terminal in the case at issue; the conductive leads 115S, 115G, 115D have a cross section generally rectangular in shape, with the drain conductive lead 115D having the cross-section larger than the cross-section of the other conductive leads 115S and 115G.

Moreover, on each main surface 110A and 110B there is exposed a dissipation plate 120A and 120B, respectively, in thermally and possibly electrically conductive material, such as copper); each dissipation plate 120A, 120B has a generally rectangular shape, and extends over approximately half the respective main surface 110A, 110B. The dissipation plate 120A, 120B defines a surface exposed from the insulating body 105 of an internal heat sink (not visible in the figure) for the chips. In addition, the dissipation plate 120A, 120B may be electrically connected to a conduction terminal of the chips (e.g., to the source terminal).

Figure 2A:
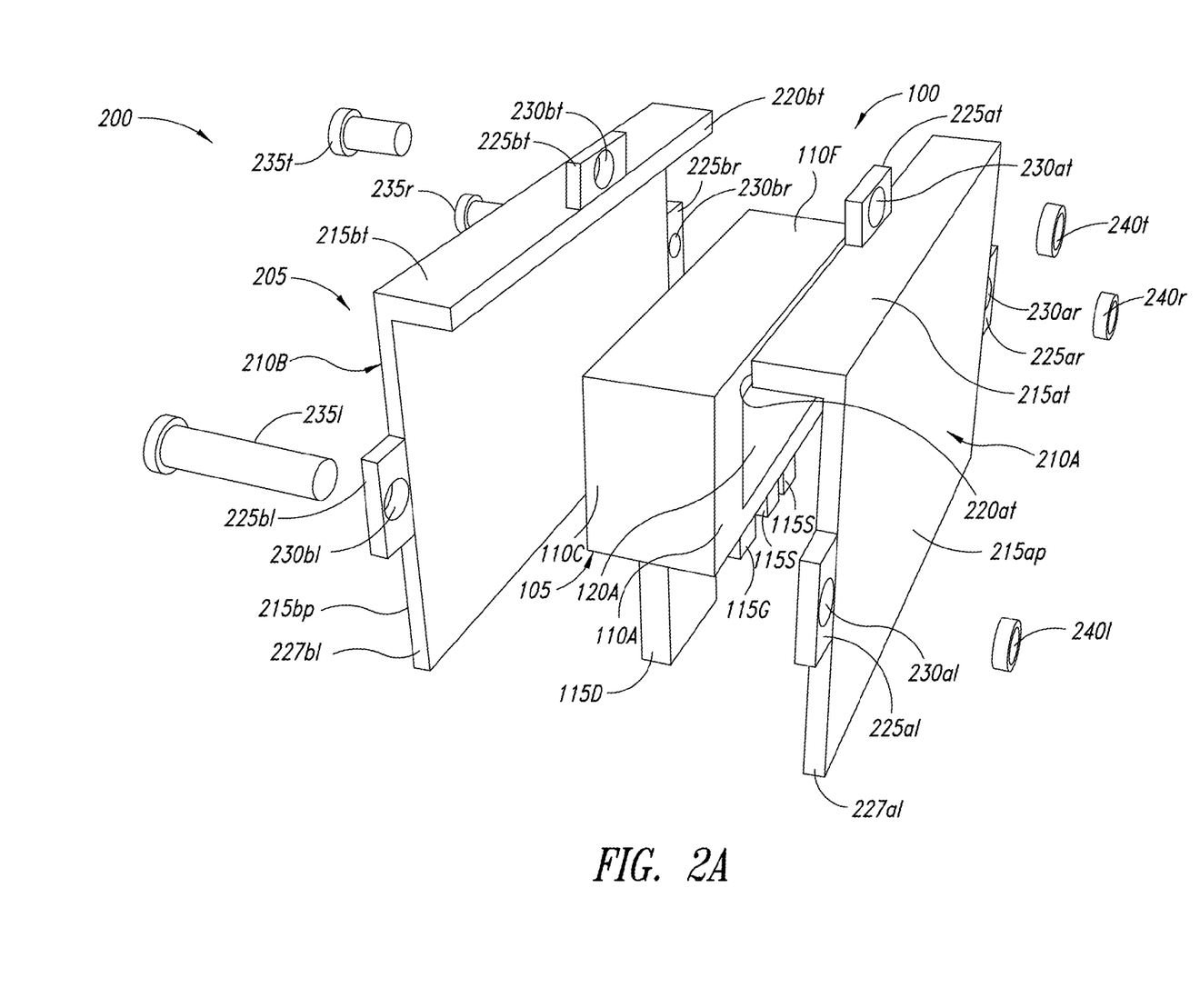
FIGS. 2A and 2B show schematic perspective exploded and overall views, respectively, of the electronic system according to an embodiment of the present disclosure.
Figure 2B:
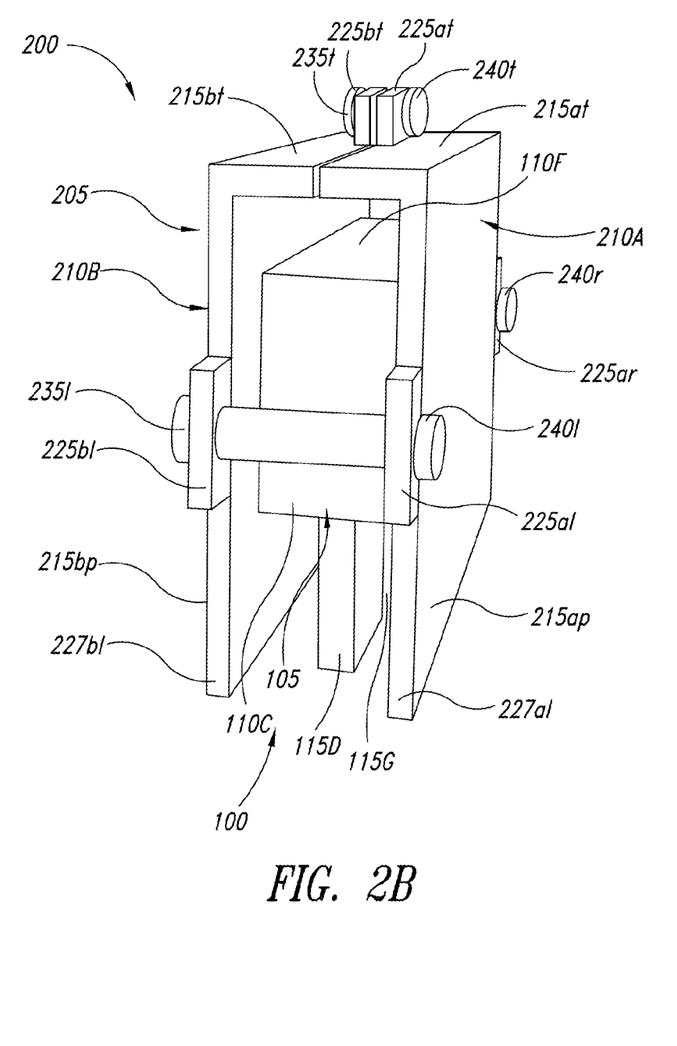

Considering now jointly the FIGS. 2A and 2B, they show schematic perspective exploded and overall views, respectively, of an electronic system 200 according to an embodiment of the present disclosure.

The electronic system 200 comprises the electronic device 100 described above and an (external) heat sink 205, formed in a thermally and possibly electrically conductive material (such as copper), in contact with the dissipation plates 120A, 120B.

In the solution according to an embodiment of the present disclosure, the heat sink 205 comprises a first dissipation element 210A and a second dissipation element 210B. As described in detail below, the dissipation elements 210A and 210B are clamped together against the insulating body 105.

The electronic system 200 according to an embodiment of the present disclosure allows reducing an overall size of the insulating body 105 (as it no longer requires any perforated portion for fixing the heat sink, whereby the insulating body 105 may be entirely used for embedding the chips).

In addition, the stresses caused by the clamping of the dissipation elements 210A, 210B against the insulating body 105 are distributed throughout the same (and no more concentrated in its perforated portion). This reduces the risk of deforming (or breaking at the limit) the insulating body 105 (and thus compromising the fastening between the insulating body 105 and the heat sink 205 and with that also the heat dissipation), and/or the conductive leads 115S, 115G, 115D (and therefore the quality of the electrical connections formed and thereby the performance of the electronic components comprised in the package). Consequently, the fastening of the heat sink 205 to the insulating body 105 is better in terms of robustness and efficiency.

In the particular embodiment at issue, the dissipation element 210A is arranged in contact with the dissipation plate 120A and the dissipation element 210B is arranged in contact with the dissipation plate 120B. In more detail, each dissipation element 210A, 210B comprises a main portion 215*ap*, 215*bp* (formed by a plate of generally rectangular shape, with an extent greater than that of the main surfaces 110A, 110B of the insulating body 105); the dissipation element 210A, 210B further comprises a top (transversal) portion 215*at*, 215*bt*, which extends transversely (i.e., perpendicularly) from an upper edge of the main portion 215*ap*, 215*bp* opposite the mounting surface 110M, for a distance substantially equal to half the thickness of the insulating body 105 (defined by half the width of its free surface 110F).

Each dissipation element 210A, 210B is provided with protruding appendages (of generally rectangular shape). In the example at issue, an (upper) appendage 225*at*, 225*bt* protrudes perpendicularly from a free edge of the top portion 215*at*, 215*bt* (at the center thereof) towards the outside of the dissipation element 210A, 210B—i.e., on the opposite side of the main portion 215*ap*, 215*bp* (upward in the figure). Two additional (lateral) appendages 225*al*-225*ar*, 225*bl*-225*br* protrude from each free edge (of which only the free edges 227*al*, 227*bl* are visible in the figures) of the main portion 215*ap*, 215*bp* (in symmetrical positions with respect to the center thereof) to the outside of the dissipation element 210A, 210B—i.e., leftward and rightward, respectively. Each appendage 225*at*, 225*al*, 225*ar*, 225*bt*, 225*bl*, 225*br* is provided with a corresponding (smooth) through hole 230*at*, 230*al*, 230*ar*, 230*bt*, 230*bl*, 230*br*.

During assembly, each dissipation element 210A, 210B is placed in contact with the corresponding dissipation plate 120A, 120B of the electronic device 100; in particular, an inner surface of the main portion 215*ap*, 215*bp* is placed in contact with the entire side surface 110A, 110B of the electronic device 100. The main portion 215*ap*, 215*bp* has a greater extent than the side surface 110A, 110B has, so that the main portion 215*ap*, 215*bp* protrudes above, below, to the left and to the right of the electronic device 100.

In this configuration, the top portions 215*at* and 215*bt* abut against each other, as well as the appendages 225*at* and 225*bt* do. In addition, the through holes 230*at*, 230*al*, 230*ar* provided in the appendages 225*at*, 225*al*, 225*ar* are coaxial with the corresponding through holes 230*bt*, 230*bl*, 230*br* provided in the appendages 225*bt*, 225*bl*, 225*br*. Therefore, it is possible to clamp the first dissipation element 210A and the second dissipation element 210B with each other—together with the electronic device 100 arranged therebetween—by means of bolts each clamped between the through holes of a corresponding pair of appendages. In particular, a screw 235t is inserted into the through holes and 230at, 230bt until its head abuts against the appendage 225at, with its stem that protrudes from the appendage 225bt; at this point, a nut 240t is screwed onto the stem of the screw 235t (blocking the appendages 225at and 225bt). Similarly, two other screws 235l and 235r—longer than the screw 235t—are each one inserted into the through holes 230al-230bl, 230ar-230br, until its head abuts against the appendage 225bl, 225br with its stem that protrudes from the appendage 225l, 225r; at this point, a nut 240l, 240r is screwed onto the stem of the screw 235l, 235r (blocking the appendages 225al-225b, 225ar, 225br). In this way the dissipation elements 210A and 210B are bolted firmly together, with the respective main portions 215ap and 215bp that adhere to the dissipation plates 120A and 120B, respectively.

In the particular embodiment at issue, the fact that the main portions 215ap and 215bp protrude from the electronic device 100 defines corresponding cavities in its upper (between the free surface 110F and the top portions 215at, 215bt), bottom (in the area of the conductive leads 115S-115D), and left/right lateral (between each side surface 110C, 110D and the corresponding screw 235l, 235r) parts. Such cavities facilitate the flow of air around the electronic device 100, thereby improving the heat dissipation (e.g., by channeling a flow of cooling air, generated by a fan not shown in the figure, towards the electronic system 100).

Figure 3:
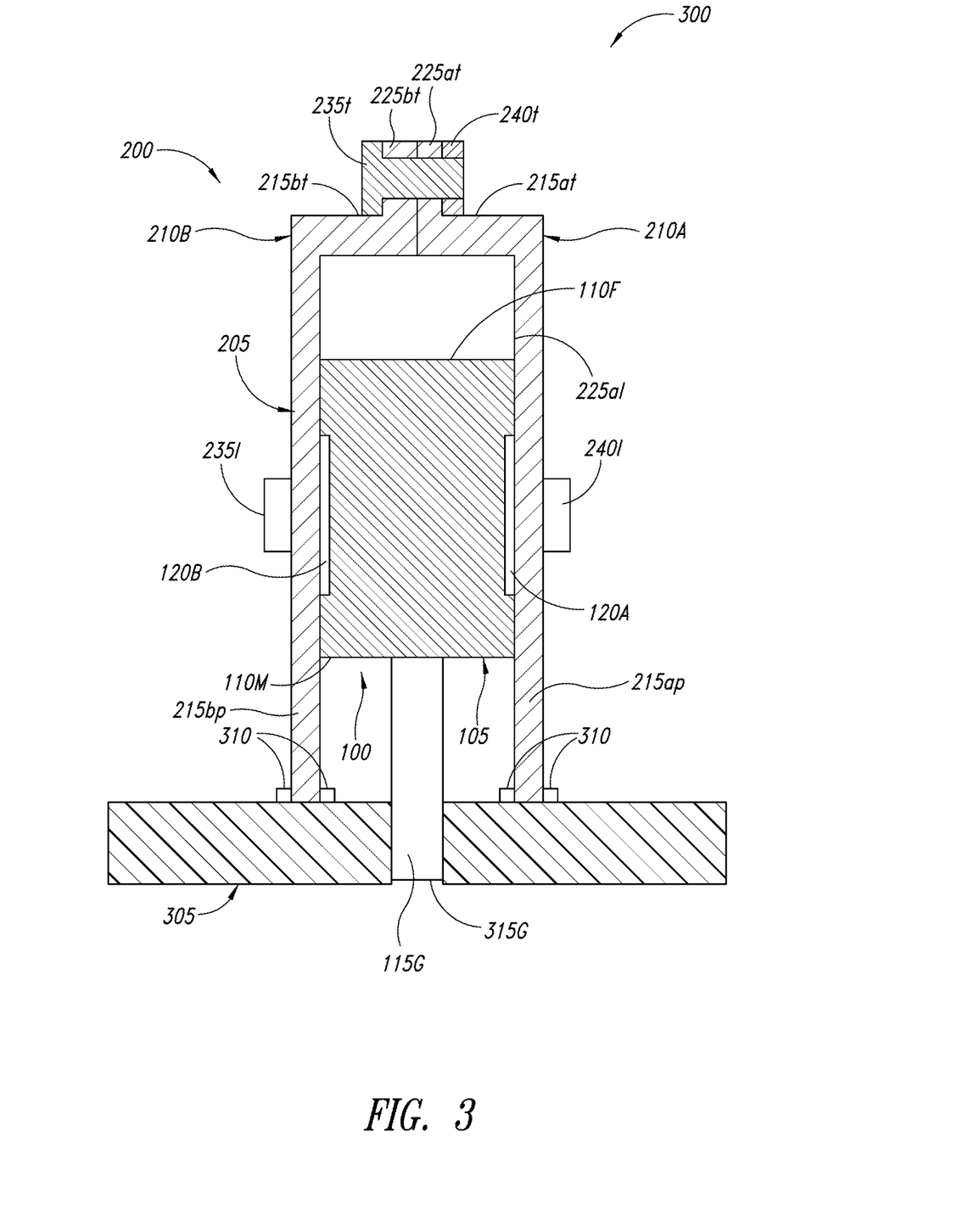
FIG. 3 illustrates a schematic cross-sectional view of an electronic assembly according to an embodiment of the present disclosure.

Turning now to FIG. 3, it illustrates a cross-sectional view of an electronic assembly 300 according to an embodiment of the present disclosure.

It should be noted that internal elements (chips, connecting wires, etc.) of the electronic device 100 have been omitted in order to avoid compromising the clarity of the description with details unnecessary for an understanding of the solution according to an embodiment of the present disclosure.

The electronic assembly 300 is formed by the electronic system 200 (with the electronic device 100 and the heat sink 205), or more, which is mounted on an electronic board 305 (e.g., a Printed Circuit Board or PCB). For this purpose, the conductive leads (of which only the conductive lead 115G is visible in the figure) are inserted into corresponding through holes (of which only one through-hole 315G for the conductive lead 115G is visible in the figure), and subsequently soldered using any known technique (e.g., by "wave soldering").

Preferably, each main portion 215ap, 215bp extends beyond the mounting surface 110M (in such a way to maintain the insulating body 105 spaced apart from the electronic board 305) until reaching a contact surface thereof. In the particular case at issue, the main portions 215ap and 215bp are connected (e.g., by interlocking or soldering) to appropriate reference terminals 310, for receiving a reference voltage (or ground).

The mechanical connection between the main portions 215ap and 215bp and the reference terminals 310 provides for an additional mechanical support (in addition to the conductive leads) to the electronic system 200. In addition, the electrical connection to the reference terminals 310 makes safe the contact of the electronic system 200 by a technician and reduces any electromagnetic interference generated by the biasing of the heat sink 205.

Figure 4:
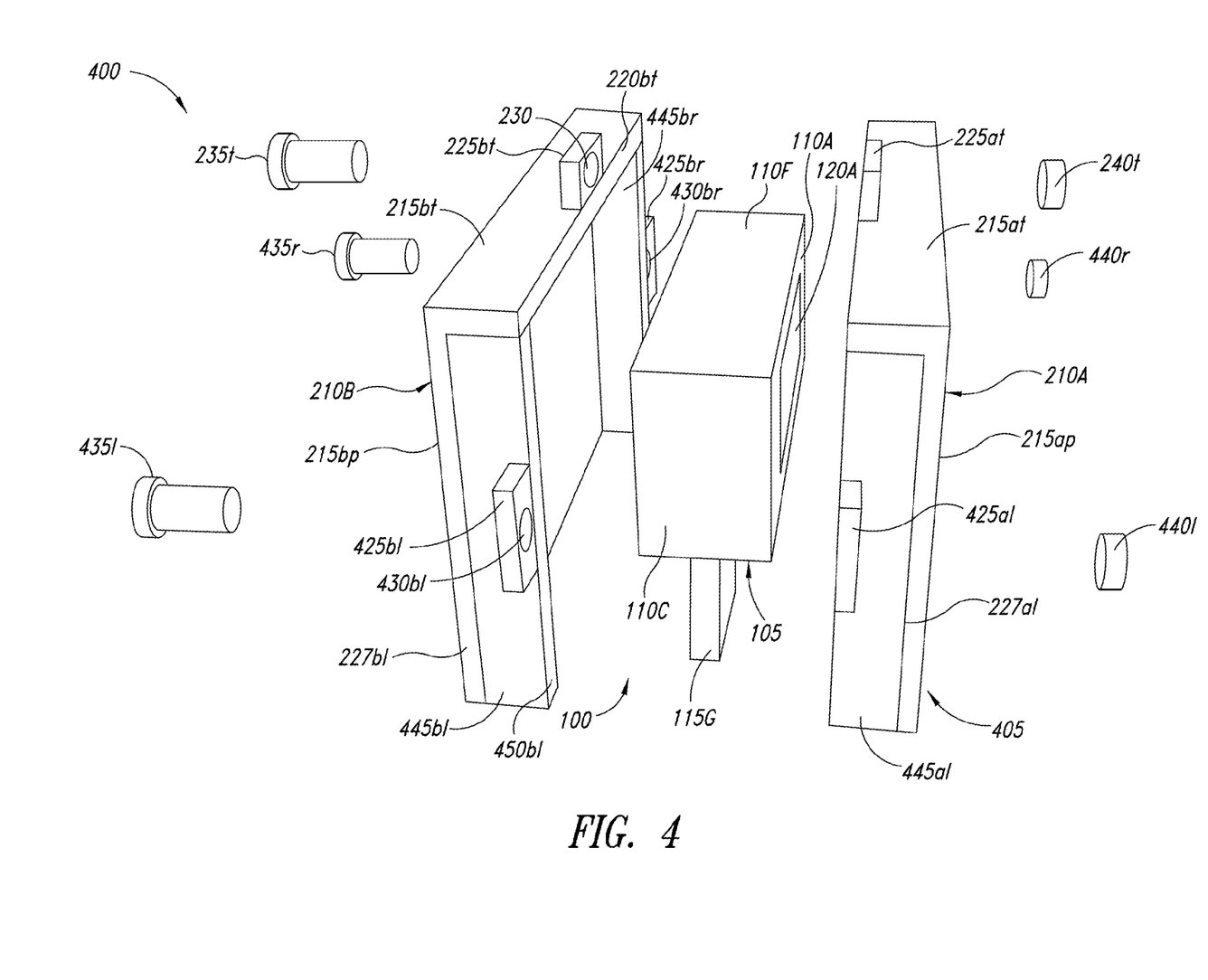
FIG. 4 illustrates a schematic perspective exploded view of the electronic system according to a further embodiment of the present disclosure.

Turning now to FIG. 4, there is shown an exploded perspective view of an electronic system 400 according to a further embodiment of the present disclosure.

The electronic system 400 comprises the same electronic device 100 described above and a different heat sink 405.

As above, the heat sink 405 comprises two dissipation elements 210A, 210B, each of which comprises the same main portion 215ap, 215bp and top portion 215at, 215bt with appendage 225at, 225bt. In this case, however, each dissipation element 210A, 210B also comprises a pair of (transversal) side portions 445al, 445bl. These side portions 445al, 445bl extend transversely (i.e., perpendicularly) from the corresponding free edges (of which only the free edges 227al, 227bl visible in the figure) of the main portion 215ap, 215bp, on the same side and with the same height of the top portion 215at, 215bt. Two (lateral) appendages 425l-425r, 425bl-425br with corresponding through holes 430al-430ar, 430bl-430br protrude perpendicularly from a corresponding free edge of each side portion 445al, 445bl (in symmetrical positions with respect to the center thereof) towards the outside of the dissipation element 210A, 210B—i.e., leftwards and rightwards, respectively.

Also in this case, two bolts each formed by a screw 435l, 435r—now equal to the screw 235t—and a nut 440L, 440R are clamped between the through holes 430al-430bl, 430ar-430br of each corresponding pair of appendages 425al-425bl, 425ar-425br.

The heat sink 405 is adapted to enclose the electronic device 100 once clamped around it (in a complete way when the electronic system 400 is mounted on an electronic board, not shown in the figure), protecting it more effectively from the external environment and from any shock that the electronic system 400 may be subject to.

Figure 5:
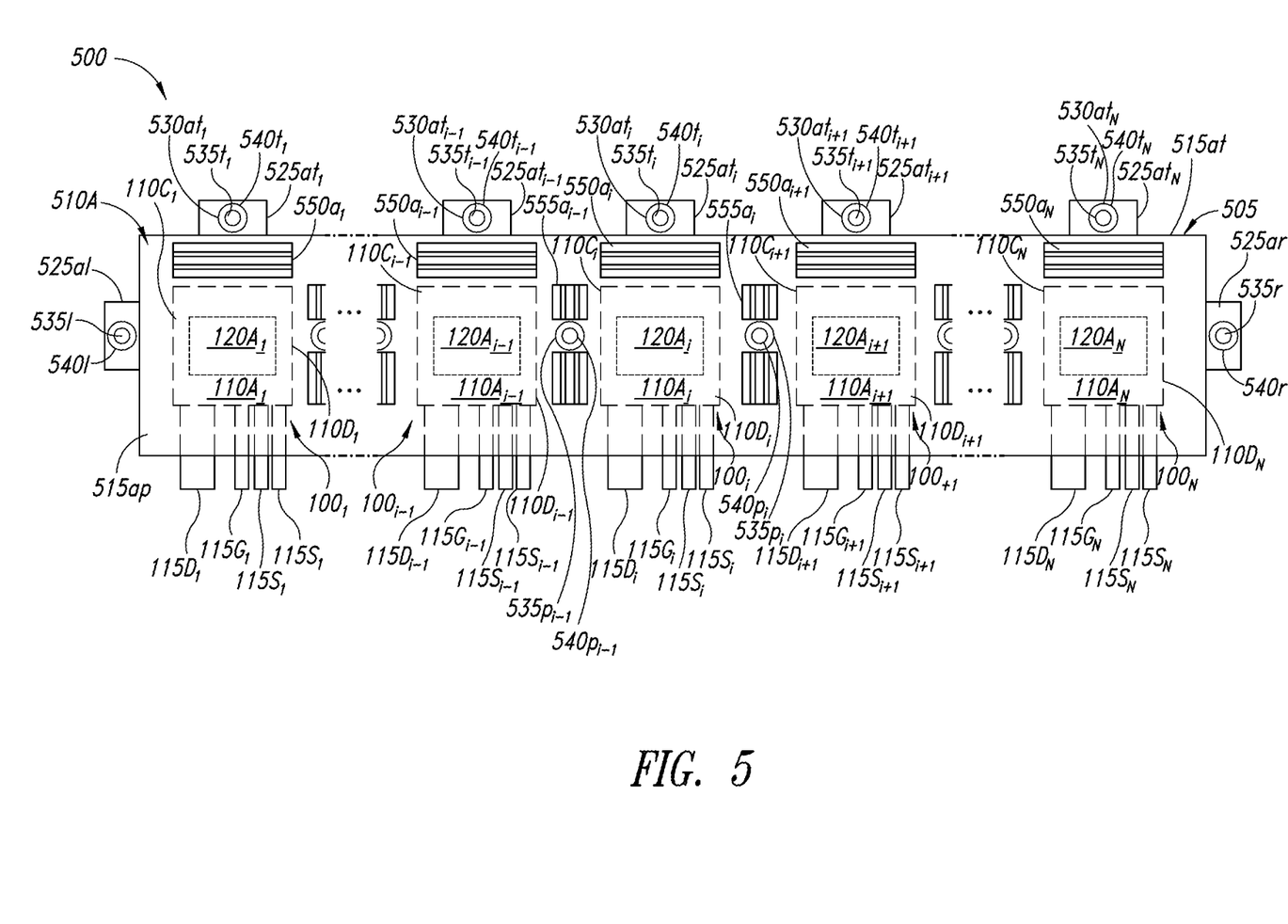
FIG. 5 shows a schematic side view of the electronic system according to a further embodiment of the present disclosure.

Turning to FIG. 5, it illustrates a schematic side view of an electronic system 500 according to a further embodiment of the present disclosure.

The electronic system 500 is distinguished by the electronic systems previously described in what follows.

The electronic system 500 comprises a plurality of electronic devices $100_i$ (i=1, N, for example, with N=2-10)—with the same index i which is also added to the references of their components. The electronic devices $100_i$ are aligned with each other in sequence, with all the main surfaces $110A_i$ and all the main surfaces $110B_i$ that lie on a corresponding same plane.

Moreover, each electronic device $100_i$ is positioned so that its lateral surface $110C_i$ is spaced apart by a predetermined distance (e.g., from 5 mm to 1 cm) from the side surface $110D_{i-1}$ of a previous electronic device $110_{i-1}$ facing it—with the exclusion of a first electronic device $100_1$. The electronic system 500 further comprises a heat sink 505. As above, the heat sink 505 comprises two dissipation elements 510A, 510B, each of which comprises similar main portion 515ap, 515bp and top portion 515at, 515bt (with a length greater than the entire sequence of electronic devices $110_i$). Each dissipation element 510A, 510B also comprises a similar pair of (lateral) appendages 525al-525bl, 525ar-525br with corresponding through holes 530al-530bl, 530ar-530br (not visible in the figure). In this case, however, each dissipation element 510A, 510B is provided with a plurality of similar (upper) appendages $525at_i$, $525bt_i$ with corresponding through holes $530at_i$, $530bt_i$ (one for each electronic device $110_i$), which as above protrude perpendicularly from a free edge of the top portion 515at (distributed uniformly along the same). Also in this case, similar bolts each formed by a pair of screws and nuts $535t_i$-$540t_i$, 535l-540l and 535r, 540r are clamped between the through holes of each corresponding pair of appendages $525at_i$, $525bt_i$, 525al-525bl and 525ar-525br.

As above, the dissipation elements 510A and 510B are clamped together against the electronic devices $100_i$ (with each pair of appendages 525$at_i$, 525$bt_i$ at the center of the corresponding electronic device 110$_i$).

The structure described above allows using a single heat sink for more electronic devices (thereby replicating the advantages indicated above).

Advantageously, more pairs of corresponding through holes (not visible in the figure) may be provided on the main portion 515$ap$, 515$bp$ of the dissipation element 510A, 510B. The additional through holes are arranged at the same height of the through holes of the bolts 535$l$-540$l$, 535$r$-540$r$ between each electronic device 100$_i$ (i<N) and the next electronic device 110$_{i+1}$ (at the center between them). As above, similar bolts each formed by a pair of screws and nuts 535$p_i$-540$p_i$ are clamped between each pair of corresponding through holes. In this way it is possible to ensure a better adhesion between the inner surfaces of the main portions 515$ap$ and 515$bp$ and the corresponding main surfaces 110A$_i$ and 110B$_i$ of each electronic device 100$_i$.

Advantageously, a group of corresponding (horizontal) aeration windows—for example, from 1 to 5—are opened in the main portions 515$ap$ and 515$bp$ (of which only those of the main portion 515$ap$, designated by the reference 550$a_i$, visible in the figure) above each electronic device 100$_i$. In addition, a further group of corresponding (vertical) aeration windows—e.g., from 1 to 5—are opened on the main portions 515$ap$ and 515$bp$ (of which only those of the main portion 515$ap$, designated by the reference 555$a_i$ visible in the figure) between each electronic device 100$_i$ (i<N) and the next electronic device 110$_{i+1}$ (to the left and to the right of the corresponding through hole for the bolt 535$p_i$-540$p_i$). Both the aeration windows 550$a_i$ and the aeration windows 555$a_i$ further facilitate the heat exchange by convection with the surrounding environment.

Figure 6:
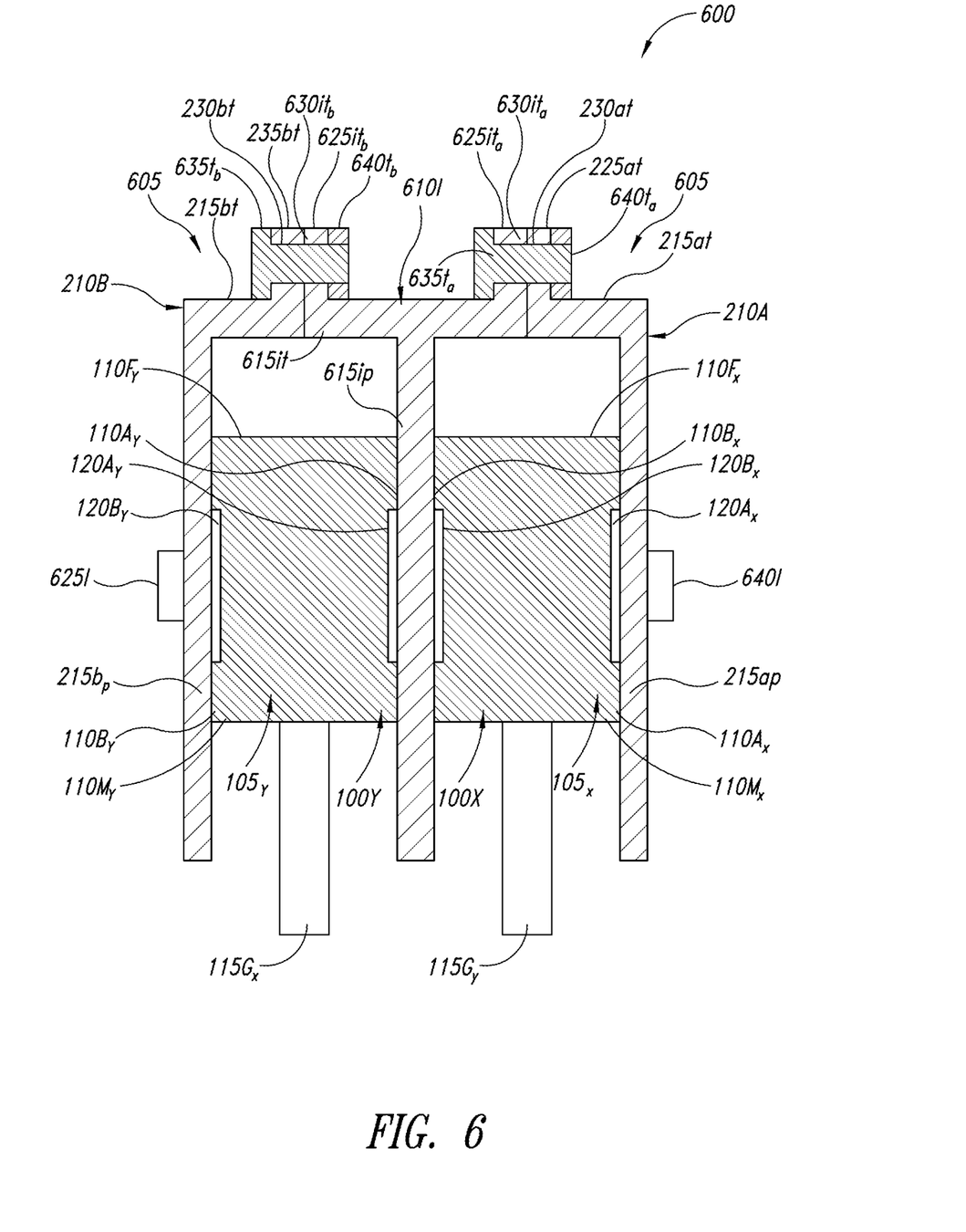
FIG. 6 illustrates a schematic side view of an electronic system according to a further embodiment of the present disclosure.

Turning now to FIG. 6, there is shown a schematic cross-sectional view of an electronic system 600 according to a further embodiment of the present disclosure.

The electronic system 600 comprises a pair of electronic devices 100X and 100Y—with the same indexes X and Y which are also added to the references of their components. The electronic devices 100X and 100Y are positioned (physically) in parallel with each other (with the main surface 110B$_X$ facing the main surface 110A$_Y$).

The electronic system 600 further comprises a heat sink 605. As above, the heat sink 605 comprises the two dissipation elements 210A, 210B previously described and an (intermediate) dissipation element 610$l$, interposed between the electronic devices 100X and 100Y. The dissipation element 610$l$ comprises a main portion 615$ip$ (similar to those of the dissipation elements 210A, 210B); the dissipation element 610$l$ further comprises a (transversal) top portion 615$it$, which extends transversely (i.e., perpendicularly), in opposite directions, from an upper edge of the main portion 615$ip$ opposite the mounting surfaces 110M$_X$ and 110M$_Y$. In detail, the top portion 615$it$ extends, in both directions, for a distance substantially equal to half the thickness of the insulating bodies 105$_X$ and 105$_Y$ (defined by half-width of the respective free surfaces 110F$_X$ and 110F$_Y$).

The dissipation element 610$l$ is provided with a pair of (upper) appendages 625$it_a$, 625$it_b$ with corresponding through holes 630$it_a$-630$it_b$ (similar and corresponding to those of the dissipation elements 210A, 210B), which project perpendicularly from the corresponding (left and right) free edges of the top portion 615$it$ (opposite the corresponding appendages 225$at$, 225$bt$).

During the mounting, the dissipation element 210A is placed in contact with the dissipation plate 120A$_X$, the dissipation element 210B is placed in contact with the dissipation plate 120B$_Y$ and the dissipation element 610$l$ is placed in contact with the dissipation plates 120B$_X$ and 120A$_Y$ (with the main portions 215$ap$, 215$bp$ and 615$ip$ that protrude above, below, to the left and to the right from the electronic devices 100X and 100Y).

In this configuration, the top portions 215$at$ and 615$it$ and the top portions 615$it$ and 215$bt$ abut against each other, as well as the appendages 225$at$ and 625$ita$ and the appendages 625$itb$ and 225$bt$ do (with the through holes 230$at$, 230$bt$, 630$it_a$ and 630$it_b$ coaxial between each other). Two bolts each formed by a pair of screws and nuts 635$ta$-640$ta$ and 635$tb$-640$tb$ are clamped between the through holes of each corresponding pair of appendages 225$at$-625$it_a$ and 625$it_b$-225$bt$. Alternatively, it is possible to use a single bolt (not shown in the figure), with a screw of sufficient length such as to cross all the through holes 230$at$, 630$it_a$, 630$it_b$ and 230$bt$.

The heat sink 610$l$ interposed between the electronic devices 100X, 100Y allows obtaining good heat dissipation with an extremely compact structure.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment of the present disclosure proposes an electronic system. The electronic system comprises at least one electronic device of through-hole mounting type comprising an insulating body for embedding at least one chip on which at least one electronic component is integrated, a plurality of conductive leads projecting from the insulating body for said mounting, and at least one dissipation plate exposed from the insulating body for transferring heat from said at least one electronic component in operation towards the outside of the insulating body. The electronic system further comprises a heat sink in contact with said at least one dissipation plate for dissipating said heat. In the solution according to an embodiment of the present disclosure, the heat sink comprises a first dissipation element, a second dissipation element, and clamping means for clamping the first dissipation element and the second dissipation element together against the insulating body of said at least one electronic device.

However, the electronic devices may be in any number, each with any number of chips which integrate any number and/or type of electronic components, any number and/or type of conductive leads, and any dissipation plate (see below); furthermore, it is possible to interpose a thermally conductive and/or electrically insulating epoxy resin between each dissipation plate and the corresponding dissipation element.

In an embodiment of the electronic system, the at least one electronic device comprises at least one sequence of electronic devices arranged in parallel to each other between the first dissipation element and the second dissipation element. Moreover, the heat sink further comprises an intermediate dissipation element between each pair of adjacent electronic devices in the sequence in contact with at least one of the corresponding dissipation plates. The clamping means comprising means for clamping the first dissipation element and the intermediate dissipation element of a first pair of electronic devices of the sequence together against the insulating body of a first electronic device of the sequence. The clamping means also comprises means for clamping the intermediate dissipation element of a last pair of electronic devices of the sequence and the second dissipation element together against the insulating body of a last electronic device of the sequence. Finally, the clamping means comprises means for clamping together any possible pair of intermediate dissipation elements being adjacent in the sequence against the insulating body of an electronic device interposed therebetween.

However, the intermediate dissipation elements may be in any number (one or more) and with any arrangement (e.g., only between selected pairs of electronic devices).

In an embodiment of the electronic system, the clamping means comprises a plurality of appendages protruding from the first dissipation element, a plurality of corresponding appendages protruding from the second dissipation element and a plurality of corresponding appendages protruding from any possible intermediate dissipation element; in particular, each appendages comprises a smooth through hole. In addition, the clamping means comprises a plurality of bolts each clamped between the through holes of a corresponding pair of appendages coaxial to each other; each pair of appendages is arranged on the first dissipation element and on the second dissipation element, on the first dissipation element and on the intermediate dissipation element of the first pair of electronic devices, on the intermediate dissipation element of the last pair of electronic devices and on the second dissipation element, and/or on each pair of adjacent intermediate dissipation elements.

However, nothing prevents providing the appendages with corresponding threaded through holes and use screws that are suitable to be screwed into the threaded holes, or clamping means of any other type.

In an embodiment of the electronic system, the at least one dissipation plate comprises a first dissipation plate exposed on a first surface of the insulating body and a second dissipation plate exposed on a second surface of the insulating body opposite the first surface. The first dissipation element is in contact with the first dissipation plate, the second dissipation element is in contact with the second dissipation plate, and any possible intermediate dissipation element is in contact with the second dissipation plate of a first electronic device and with the first dissipation plate of a second electronic device, respectively, of the corresponding pair of electronic devices.

However, nothing prevents providing for more than one dissipation plate exposed on each surface of the insulating body; conversely, the application to an electronic device with a single dissipation plate is not excluded.

In an embodiment of the electronic system, the first dissipation element, the second dissipation element and any possible intermediate dissipation element each comprises a main portion in contact with each corresponding dissipation plate, and a transversal portion extending transversely from an edge of the main portion opposite the conductive leads of said at least one electronic device for abutting against the transversal portion of another adjacent dissipation element.

However, it is possible to use dissipation elements of different types (for example, with transversal portions adapted to engage with each other by interlocking), or even without any transversal portion; moreover, the dissipation elements may also be different from each other (e.g., with a transversal portion with double extent on only one of each pair).

In an embodiment of the electronic system, the first dissipation element, the second dissipation element and any possible intermediate dissipation element each further comprises a pair of further transversal portions extending transversely from further edges of the main portion being adjacent to said edge for abutting against the further transversal portions of the other adjacent dissipation element.

However, such a characteristic may be implemented also in the case of more electronic devices aligned and/or in parallel; moreover, as above the further transversal portions may be of different type, completely absent, or different from each other.

In an embodiment of the electronic system, the transversal portion and/or the pair of further transversal portions are spaced apart from the insulating body of said at least one electronic device.

However, nothing prevents forming the heat sink so that the transversal portion and/or the pair of further transversal portions are (at least in part) adherent to the insulating body of one or more electronic devices.

In an embodiment of the electronic system, the at least one electronic device comprises at least one further sequence of electronic devices spaced apart along the first dissipation element and the second dissipation element.

However, the sequences of electronic devices may be in any number (one or more), with each of them formed by both isolated electronic devices and groups of electronic devices in parallel.

In an embodiment of the electronic system, each dissipation element comprises at least one aeration window opened in a portion of the dissipation element not in contact with the insulating body of said at least one electronic device.

However, such a characteristic may be implemented even in the case of a single electronic device or a single sequence of electronic devices in parallel. In any case, nothing prevents forming the aeration windows in different number, shape and/or placement, only above the electronic devices, only between each pair of them, or in any other position (even in a portion of the dissipation element partially in contact with the electronic devices); on the contrary, the aeration windows may be entirely omitted.

In an embodiment of the electronic system, each dissipation element extends beyond the insulating body of said at least an electronic device in correspondence to the conductive leads.

However, it is possible to form each dissipation element in such a way that it extends to a different extent than the insulating body of each electronic device, forming only one between the first and the second dissipation element (and any intermediate dissipation elements) so as to extend beyond the insulating body, or none of them.

A different aspect of the solution according to an embodiment of the present disclosure proposes a heat sink for use in the electronic system according to what has been described above.

However, the heat sink may comprise alternative and/or additional features. For example, nothing prevents forming fins projecting from each dissipation element. Furthermore, it is to be noted that the heat sink is adapted to be manufactured and marketed also as a stand-alone product, for use with electronic devices already existing.

A different aspect of the solution according to an embodiment of the present disclosure proposes an electronic assembly comprising a circuit board and at least one electronic system according to what has been described above being mounted on the circuit board.

However, the electronic assembly may comprise electronic systems in any number (one or more) and of any type described above (in any combination among them); furthermore, the electronic systems may be attached to the electronic board in another way (even only through their conductive leads).

In general, similar considerations apply if the electronic system and/o the electronic assembly has a different structure or comprises equivalent components (e.g., in different materials), or it has other operating characteristics. In any case, any of its components may be separated into several elements, or two or more components may be combined into a single element; moreover, each component may be replicated for supporting the execution of the corresponding operations in parallel. It should also be noted that (unless stated otherwise) any interaction between different components generally need not to be continuous, and may be direct or indirect via one or more intermediaries.

Another aspect of the solution according to an embodiment of the present disclosure proposes an apparatus comprising at least one of such electronic systems and/or electronic assemblies (e.g., a power supply unit, a battery charger, an automotive apparatus, and the like).

A different aspect of the solution according to an embodiment of the present disclosure proposes a method for assembling an electronic system. The method comprises the following steps. At least one electronic device of through hole mounting type is provided; said electronic device has an insulating body for embedding at least one chip on which at least one electronic component is integrated, a plurality of conductive leads protruding from the insulating body for said mounting, and at least one dissipation plate exposed from the insulating body for transferring heat from said at least one electronic component in operation towards the outside of the insulating body. The method involves the step of mounting a heat sink in contact with said at least one dissipation plate for dissipating said heat. In the solution according to an embodiment of the present disclosure, the step of mounting the heat sink comprises providing a first dissipation element, providing a second dissipation element, and clamping the first dissipation element and the second dissipation element together against the insulating body of said at least one electronic device.

However, similar considerations may apply if the same solution is implemented by an equivalent method (using similar steps, removing some steps being not essential, or adding further optional steps); moreover, the steps may be performed in different order, in parallel or overlapped (at least in part).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic system, comprising:
a first electronic device including:
a first die including integrated electronic components;
a first insulating body that encapsulates the first die;
a plurality of conductive leads projecting from the insulating body; and
a first dissipation plate exposed from the insulating body and
arranged to transfer heat from said electronic components during operation, the first dissipation plate facing outside of the insulating body;
a second electronic device arranged in parallel with the first electronic device, both the first and second electronic device being between the first dissipation element and the second dissipation element of the heat sink, the second electronic device including:
a second die including integrated electronic components;
a second insulating body that encapsulates the second die;
a plurality of conductive leads projecting from the second insulating body; and
a second dissipation plate exposed from the second insulating body and arranged to transfer heat from said electronic components during operation, the second dissipation plate facing an outside of the second insulating body; and
a heat sink in contact with said first dissipation plate, the heat sink including:
a first dissipation element;
a second dissipation element; and
an intermediate dissipation element between the first and second electronic devices;
clamping devices that attach the first dissipation element and the second dissipation element together against the insulating body of said electronic device, wherein the clamping devices attach the first dissipation element and the intermediate dissipation element together against the first insulating body of the first electronic device and attach the intermediate dissipation element and the second dissipation element together against the second insulating body of the second electronic device.

2. The electronic system according to claim 1, further comprising:
a third electronic device positioned between the first dissipation element and the second dissipation element, the third electronic device including:
a third die including integrated third electronic components;
a third insulating body that encapsulates the third die;
a plurality of conductive leads projecting from the third insulating body; and
a third dissipation plate exposed from the third insulating body and, arranged to transfer heat from said third electronic components during operation, the third dissipation plate facing an outside of the third insulating body.

3. The electronic system according to claim 1 wherein:
the first dissipation element includes a first aeration window opened in a portion of the first dissipation element not in contact with the first insulating body of said first electronic device; and
the second dissipation element includes a second aeration window opened in a portion of the second dissipation element not in contact with the second insulating body of said second electronic device.

4. The electronic system according to claim 1 wherein the first and second dissipation elements extend beyond the first and second insulating bodies, respectively, and respectively cover portions of the respective conductive leads.

5. An electronic system, comprising:
a first electronic device including:
a first die including integrated electronic components;
a first insulating body that encapsulates the first die;
a plurality of conductive leads projecting from the insulating body; and
a first dissipation plate exposed from the insulating body and arranged to transfer heat from said electronic components during operation, the first dissipation plate facing outside of the insulating body;
a second electronic device arranged in parallel with the first electronic device,
both the first and second electronic device being between the first dissipation element and the second dissipation element of the heat sink, the second electronic device including:
a second die including integrated electronic components;
a second insulating body that encapsulates the second die;
a plurality of conductive leads projecting from the second insulating body; and
a second dissipation plate exposed from the second insulating body and arranged to transfer heat from said electronic components during operation, the second dissipation plate facing an outside of the second insulating body; and
a heat sink in contact with said first dissipation plate, the heat sink including:
a first dissipation element;
a second dissipation element; and
an intermediate dissipation element between the first and second electronic devices;
clamping devices that attach the first dissipation element and the second dissipation element together against the insulating body of said electronic device, wherein the clamping devices include:
a plurality of first appendages protruding from the first dissipation element;
a plurality of second appendages protruding from the second dissipation element; and
a plurality of third appendages protruding from the intermediate dissipation element, each of the first, second, and third appendages including a through hole; and
a plurality of bolts that interact with the through holes of a corresponding pair of the first, second, and third appendages coaxial to each other, each pair of appendages being arranged on the first dissipation element and on the second dissipation element, on the first dissipation element and on the intermediate dissipation element, and on the intermediate dissipation element and on the second dissipation element.

6. The electronic system according to claim 5, wherein the first electronic device includes a third dissipation plate, the first dissipation plate exposed on a first surface of the first insulating body and the third dissipation plate exposed on a second surface of the first insulating body opposite the first surface, the first dissipation element being in contact with the first dissipation plate, and the intermediate dissipation element being in contact with the third dissipation plate.

7. An electronic system, comprising:
a first electronic device including:
a first die including integrated first electronic components;
a first insulating body that encapsulates the first die;
a plurality of first conductive leads projecting from the first insulating body; and
a first dissipation plate exposed from the insulating body and
arranged to transfer heat from said first electronic components during operation, the first dissipation plate facing outside of the insulating body;
a heat sink in contact with said first dissipation plate, the heat sink including:
a first dissipation element;
a second dissipation element; and
clamping devices that attach the first dissipation element and the second dissipation element together against the insulating body of said electronic device;
a second electronic device adjacent to the first electronic device, the first and second electronic device being between the first dissipation element and the second dissipation element of the heat sink, the second electronic device including:
a second die including integrated second electronic components;
a second insulating body that encapsulates the second die;
a plurality of second conductive leads projecting from the second insulating body; and
a second dissipation plate exposed from the second insulating body and arranged to transfer heat from said second electronic components during operation, the second dissipation plate facing an outside of the second insulating body, wherein:
the first electronic device includes a third dissipation plate, the first dissipation plate exposed on a first surface of the first insulating body and the third dissipation plate exposed on a second surface of the first insulating body opposite the first surface, the first dissipation element being in contact with the first dissipation plate;
the heat sink includes an intermediate dissipation element between the first and second electronic devices and in contact with the third dissipation plate;
the first dissipation element includes a first main portion in contact with the first dissipation plate and a transversal portion extending transversely from an edge of the first main portion opposite the first conductive leads of said first electronic device;
the second dissipation element includes a second main portion in contact with the second dissipation plate and a transversal portion extending transversely from an edge of the second main portion opposite the second conductive leads of said second electronic device; and
the intermediate dissipation element includes a third main portion in contact with the third dissipation plate, a first transversal portion extending transversely from an edge of the third main portion opposite the first conductive leads of said first electronic device, and a second transversal portion extending transversely from an edge of the third main portion opposite the second conductive leads of said second electronic device, the first transversal portion of the first dissipation element abutting the first transversal portion of the intermediate dissipation element, and the first transversal portion of the second dissipation element abutting the second transversal portion of the intermediate dissipation element.

8. The electronic system according to claim 7 wherein:
the first dissipation element includes a pair of further transversal portions extending transversely from further edges of the first main portion the second dissipation element includes a pair of further transversal portions extending transversely from further edges of the second main portion; and the intermediate dissipation element includes a pair of further transversal portions extending transversal from further edges of the first main portion, the further transversal portions of the intermediate element abutting the further transversal portions of the first and second dissipation elements.

9. The electronic system according to claim 8 wherein the transversal portions and the pairs of further transversal portions are spaced apart from the first and second insulating bodies.

10. A system, comprising:
a first electronic device that includes:
a first insulating body;
a first heat transfer surface exposed through a first surface of the first insulating body;
a second heat transfer surface exposed through a second surface of the first insulating body; and
a plurality of first conductive leads extending from the first insulating body;
a second electronic device that includes:
a second insulating body;
a third heat transfer surface exposed through a first surface of the second insulating body;
a fourth heat transfer surface exposed through a second surface of the second insulating body; and
a plurality of second conductive leads extending from the second insulating body;
a heat sink that includes:
a first plate positioned adjacent to the first heat transfer surface of the first electronic device;
a second plate positioned adjacent to the second heat transfer surface of the first electronic device and the first heat transfer surface of the second electronic device, the first and second plates being separated by the first electronic device;
a third plate positioned adjacent to the second heat transfer surface of the second electronic device, the second and third plates being separated by the second electronic device;

a first plurality of attachment devices that attach the first plate to the second plate around the first electronic device; and a second plurality of attachment devices that attach the second plate to the third plate around the second electronic device, wherein:

the first plate includes a first main portion in contact with the first heat transfer surface of the first electronic device and a transversal portion extending transversely from an edge of the first main portion opposite the first conductive leads of said first electronic device;

the second plate includes a second main portion in contact with the second heat transfer surface of the first electronic device, a first transversal portion extending transversely from an edge of the second main portion opposite the first conductive leads of said first electronic device, and a second transversal portion extending transversely from an edge of the second main portion opposite the second conductive leads of said second electronic device; and the third plate includes a third main portion in contact with the second heat transfer surface of the second electronic device and a transversal portion extending transversely from an edge of the third main portion opposite the second conductive leads of the second electronic device, the first transversal portion of the first dissipation element abutting the first transversal portion of the second dissipation element, and the second transversal portion of the second dissipation element abutting the transversal portion of the third plate.

* * * * *

UNITED STATES PATENT AND TRADEMARK OFFICE
CERTIFICATE OF CORRECTION

PATENT NO. : 9,125,322 B2
APPLICATION NO. : 13/871803
DATED : September 1, 2015
INVENTOR(S) : Cristiano Gianluca Stella It is certified that error appears in the above-identified patent and that said Letters Patent is hereby corrected as shown below:

Title page,

Item (71):
"STMicroelectronics S.r.I., Agrate Brianza (IT)" should read, --STMicroelectronics S.r.l., Agrate Brianza (IT)--.

In the claims,

Column 12, Line 55:
"body and, arranged to transfer heat from said third" should read, --body and arranged to transfer heat from said third--.

Column 15, line 5:
"further transversal portions extending transversal from" should read, --further transversal portions extending transversely from--.

Signed and Sealed this
Third Day of May, 2016

Michelle K. Lee
*Director of the United States Patent and Trademark Office*